United States Patent [19]

Davis

[11] 4,422,039
[45] Dec. 20, 1983

[54] SELF-POWERED AMMETER
[75] Inventor: Lee A. Davis, Audubon, N.J.
[73] Assignee: Brown Boveri Electric Inc., Rolling Meadows, Ill.
[21] Appl. No.: 256,998
[22] Filed: Apr. 24, 1981
[51] Int. Cl.³ .................... G01R 19/22; G01R 1/20
[52] U.S. Cl. ................................ 324/119; 324/127
[58] Field of Search ............... 324/127, 133, 119; 323/272, 317

[56] References Cited
U.S. PATENT DOCUMENTS
2,724,821 11/1955 Schweitzer, Jr. ............... 324/127

Primary Examiner—Ernest F. Karlsen
Attorney, Agent, or Firm—Ostrolenk, Faber, Gerb & Soffen

[57] ABSTRACT

A self-powered ammeter is disclosed. A metering circuit receives an a-c current to be tested and then generates a d-c voltage whose magnitude is proportional thereto. A display circuit receives the d-c metered voltage and provides a visual indication of the magnitude of the measured current. The current to be measured also drives a current transformer which, in turn, has an output burden circuit which produces a regulated power supply for the metering and display circuit components.

5 Claims, 1 Drawing Figure

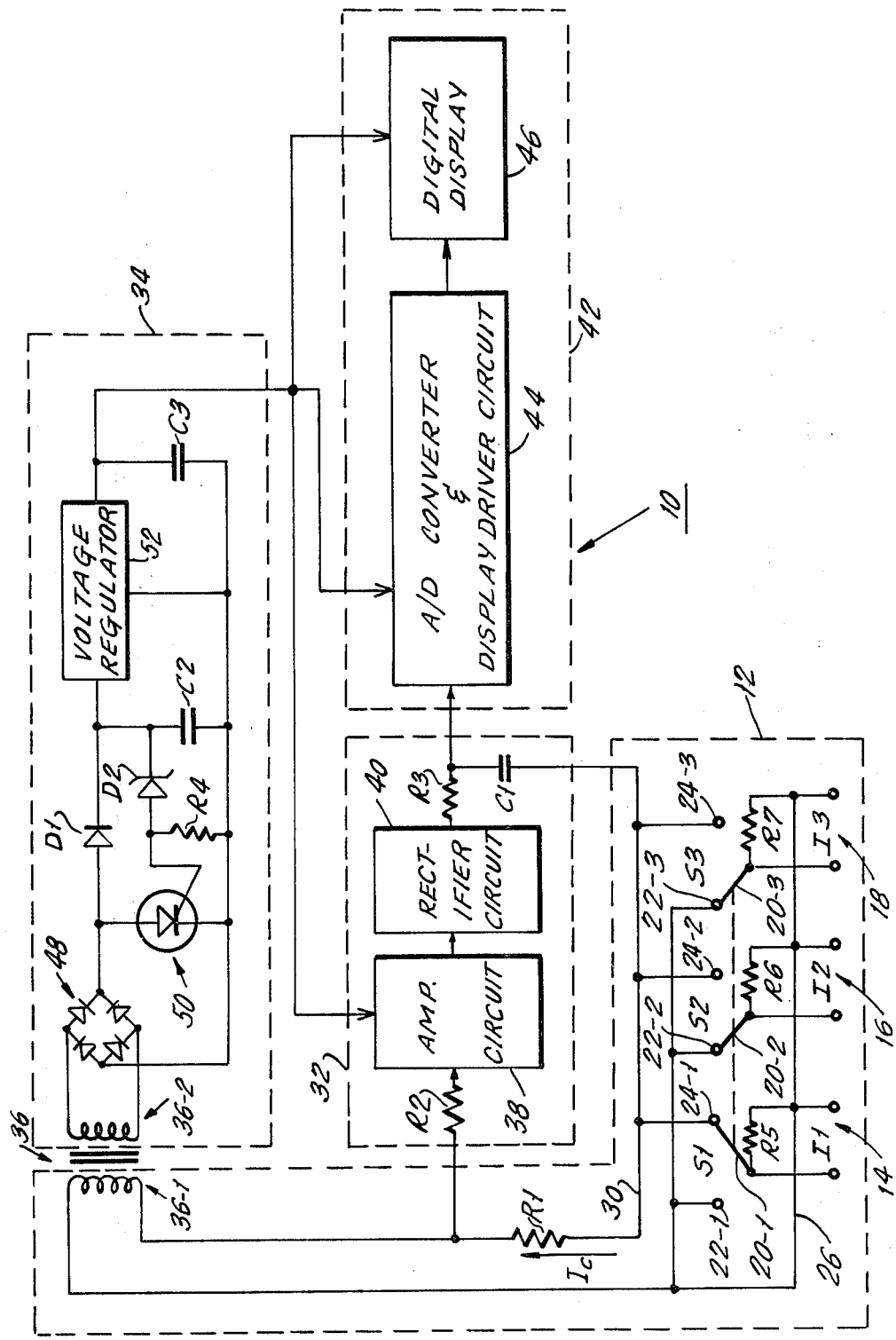

SELF-POWERED AMMETER

BACKGROUND AND SUMMARY OF THE INVENTION

This invention relates to ammeters, and more specifically relates to a self-powered ammeter.

In accordance with the invention, an input circuit applies the current to be measured to both a metering circuit and a power supply module. The metering circuit measures the magnitude of a selected input current and generates an output voltage indicative thereof. This voltage is applied to a display circuit which preferably, but not necessarily, provides a digital indication of the magnitude of the selected current.

The power supply circuit includes a current transformer having a primary winding connected in series with the metering circuit input. The secondary winding of the current transformer acts basically as a current source into a burden circuit and acts to charge a power supply capacitor through a suitable rectifier circuit, with voltage regulator means being provided to control the capacitor charge in a novel manner. The output voltage of the novel power supply circuit is then used to power both the metering and the display circuit. In this manner, the ammeter is a self-contained, self-powered unit which will provide a visual read-out of the magnitude of the input currents applied to the ammeter. One of several input currents can be measured through a switching circuit which does not open-circuit the current transformer.

BRIEF DESCRIPTION OF THE DRAWING

For the purpose of illustrating the invention, there is shown in the drawing an embodiment which is presently preferred; it being understood, however, that the invention is not limited to the precise arrangements and instrumentalities shown.

The sole FIGURE is a circuit diagram of a self-powered ammeter constructed in accordance with the principles of the present invention.

DETAILED DESCRIPTION OF THE PREFERRED EMBODIMENT

Referring now to the drawing, there is shown a self-powered ammeter 10 constructed in accordance with the principles of the present invention.

Ammeter 10 includes an input circuit 12 preferably adapted to apply any one of three input signals I1, I2, I3 to a current metering circuit 32 and a power circuit 34. Any desired number of input signals could be selected. For the embodiment shown, input circuit 12 includes three input terminals 14, 16 and 18 which are adapted to receive the respective a-c signals I1, I2 and I3. Each input terminal 14, 16, 18 includes a left-hand contact connected to a respective push-button switch S1, S2, S3 and a right-hand contact connected to a common line 26. Each switch S1, S2, S3 includes a blade 20-1, 20-2, 20-3 (hereinafter referred to generally as blade 20) which is movable between a left-hand contact 22-1, 22-2, 22-3 (hereinafter referred to generally as left-hand contact 22) and a right-hand contact 24-1, 24-2, 24-3 (hereinafter referred to generally as right-hand contact 24), respectively. Each of the left-hand contacts 22 are coupled to common line 26 and thereby short-circuit their respective input terminals 14, 16, 18 when their respective switch blade 20 is connected thereto. Each of the right-hand contacts 24 are connected to input line 30 which carries the input current Ic to be measured by metering circuit 32.

Switches S1, S2, S3 are preferably interconnected in a manner which ensures that only one switch is closed (i.e., its movable contact 20 is connected to its right-hand contact 24) at any given time. Accordingly, only one input current I1, I2, I3 will be applied to input line 30 as the selected current signal Ic at any given time. This will prevent open-circuiting the current transformer which will be later described.

A resistor R1 carries the selected current signal Ic and produces a voltage thereacross which is proportional to the current Ic and, therefore, to the selected input current I1. This voltage is applied to metering circuit 32 which generates a d-c signal indicative of the current magnitude of the selected input signal I1. Metering circuit 32 includes an amplifier circuit 38 which receives the a-c voltage across resistor R1 via resistor R2 and generates an a-c output signal whose magnitude is proportional to the selected current signal Ic. The amplified signal is applied to rectifier circuit 40 which generates a d-c signal at its output. The d-c output signal is applied to an RC filter including resistor R3 and capacitor C1 causing a d-c voltage to appear across capacitor C1. The d-c voltage across capacitor C1 is proportional in magnitude to the selected input current Ic and is applied to a display circuit 42.

Display circuit 42 preferably includes an analog-to-digital converter and display driver circuit 44 which generates digital output signals which are applied to a digital display 46. Digital display 46 provides a visual indication of the magnitude of the selected input current. While any suitable circuit may be used, one commercially available analog-to-digital converter and display driver circuit is manufactured by Intersil under the product disignation ICL7106. One suitable digital display is a liquid crystal display having the product desingnation DS300.

In order to function, amplifier circuit 38, driver circuit 44 and digital display 46 must be provided with a regulated d-c voltage generated by an appropriate power supply. To this end, power circuit 34 converts the selected current signal Ic to a d-c power signal meeting these requirements where power for the power supply is derived from the current to be measured.

In accordance with the invention, the selected input current signal Ic is applied to the primary winding 36-1 of current transformer 36. Current transformer 36 has a secondary winding 36-2 which is connected to a burden circuit which includes single phase, full wave bridge 48. Since current transformer 36 is basically a current source, the output voltage on the secondary windng 36-2 will be limited only by the impedance connected across the secondary winding 36-2. This voltage charges capacitor C2 via diode D1 until the voltage across capacitor C2 becomes greater than the reverse breakdown voltage of Zener diode D2. At this point, the voltage across capacitor C2 is applied to the gate of thyristor 50 via resistor R4, thereby firing thyristor 50. The firing of thyristor 50 short-circuits diode bridge 48 and prevents additional charge from being applied to capacitor C2. Capacitor C2 is prevented from discharging through thyristor 50 by diode D1. While capacitor C2 does not discharge via thyristor 50, it will slowly discharge due to unavoidable losses in the circuit. Whenever the voltage across the capacitor C2 falls below the reverse breakdown voltage of diode D2, thyristor 50 will cut off, permitting additional charge to be applied to capacitor C2 via diode D1. In this manner, thyristor 50 and diode D2 cooperate to regulate the voltage across capacitor C2. As such, a relatively stable voltage appears across capacitor C2. This voltage is further regulated by a suitable voltage regulator circuit 52 which provides a highly stable d-c voltage across capacitor C3. This d-c voltage is applied to the metering circuit 32 and display circuit 42 to power the same.

In the foregoing example, it has been assumed that switch S1 is in the closed position and switches S2 and S3 are in the open position. Assuming that it is desirable to measure the magnitude of the current applied to input terminal 16, switch S2 will be changed. As a result, the switch arm 22-1 of switch S1 will flip from the right-hand contact 24-1 to the left-hand contact 22-1. During this transfer, there will be a short instant during which none of the throw arms 20 are connected to input line 30. In order to prevent input current transformer 36 from being open-circuited during this operation, resistors R5, R6 and R7 are connected between the right-hand contacts of input terminals 14, 16 and 18 and throw arms 20-1, 20-2 and 20-3, respectively.

In the embodiment illustrated, input circuit 12 includes three separate input terminals 14, 16 and 18. A greater or lesser number of input terminals may by employed as desired.

The present invention may be embodied in other specific forms without departing from the spirit or essential attributes thereof and, accordingly, reference should be made to the appended claims, rather than to the foregoing specification as indicating the scope of the invention.

What is claimed is:

1. A self-powered ammeter for providing a visual indication of the magnitude of an a-c current; said ammeter comprising:
   a metering circuit for generating a first d-c voltage signal indicative of the magnitude of said a-c current;
   a display circuit connected to said metering circuit and responsive to said first d-c voltage signal for providing a visual indication of the magnitude of said a-c current; and
   a power supply circuit including a current transformer having a primary winding which conducts said a-c current, and a secondary winding connected to burden circuit means; said burden circuit means having a d-c power supply output having a regulated magnitude and means for applying said power supply output to power supply inputs of both said metering circuit and said display circuit for powering the same; said burden circuit means comprising rectifier means connected to said secondary winding and voltage regulator means connected to the output of said rectifier means; said burden circuit means further including a capacitor and means for charging said capacitor to a predetermined level and for maintaining the charge on said capacitor substantially at said predetermined level; said charging means comprising a first diode for permitting charging current to flow into said capacitor but preventing discharge current to flow and thyristor means for permitting charging current to flow into said capacitor only when the charge across said capacitor is below a predetermined value.

2. The self-powered ammeter of claim 1, wherein said thyristor means is connected to said rectifier means in such a manner that said thyristor means prevents current from being applied to said diode when said thyristor means is on and permits current to flow through said diode when said thyristor means is off and a Zener diode coupled between said capacitor and said thyristor means in such a manner that said tyristor means will be turned on whenever the voltage across said capacitor is greater than the reverse breakdown voltage of said Zener diode.

3. The self-powered ammeter of claim 1, wherein said ammeter further includes an input circuit comprising a switch assembly adapted to receive a plurality of input current signals; said switch assembly applying a selected one of said input current signals to said metering circuit and said power circuit as said a-c current.

4. The self-powered ammeter of claim 3, wherein said switch assembly comprises a plurality of switches; each of said switches receiving a different one of said input current signals; said switches being interconnected in such a manner that only one of said switches will apply the current signal associated with it to said metering and power circuits at any given time.

5. The self-powered ammeter of claim 4, wherein said input circuit includes a transformer for applying said a-c signal to said power circuit and wherein said input circuit includes means for preventing said transformer from being open circuited when said switch assembly is being switched.

* * * * *